US009641660B2

(12) United States Patent
Kim

(10) Patent No.: US 9,641,660 B2
(45) Date of Patent: May 2, 2017

(54) MODIFYING SOUND OUTPUT IN PERSONAL COMMUNICATION DEVICE

(71) Applicant: Empire Technology Development LLC, Wilmington, DE (US)

(72) Inventor: Seungil Kim, Mapo-gu (KR)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/784,595

(22) PCT Filed: Apr. 4, 2014

(86) PCT No.: PCT/US2014/032922
§ 371 (c)(1),
(2) Date: Oct. 15, 2015

(87) PCT Pub. No.: WO2015/152937
PCT Pub. Date: Oct. 8, 2015

(65) Prior Publication Data
US 2016/0080537 A1 Mar. 17, 2016

(51) Int. Cl.
H04W 88/02 (2009.01)
H04M 1/60 (2006.01)
(Continued)

(52) U.S. Cl.
CPC ............ *H04M 1/6016* (2013.01); *H03G 3/32* (2013.01); *H03G 7/002* (2013.01); *H04R 3/00* (2013.01);
(Continued)

(58) Field of Classification Search
CPC ...... H04M 1/6016; H04R 3/00; H04R 29/001; H04R 2430/01; H04R 2499/11; H03G 7/002; H03G 3/32; H04W 88/02
See application file for complete search history.

(56) References Cited

U.S. PATENT DOCUMENTS 6,212,496 B1 4/2001 Campbell et al.
6,298,247 B1 10/2001 Alperovich et al.
(Continued)

OTHER PUBLICATIONS

"Executive Summary of SmartAVC™ Automatic Volume Control," accessed at https://web.archive.org/web/20150903040750/http://s3.amazonaws.com/sdieee/164-SmartAVC_Exec_Summ_05-11_.pdf, accessed on Sep. 3, 2015, pp. 2.
(Continued)

*Primary Examiner* — Chuong A Ngo
(74) *Attorney, Agent, or Firm* — Brundidge & Stanger, P.C.

(57) ABSTRACT

Technologies are generally described for modifying sound output in a personal communication device. Example devices described herein may include one or more of a communication unit, an audio processor, and/or a sound leakage detector. A communication signal may be received from the other party during personal communication by the communication unit. The communication signal may be converted by the audio processor into receiver sound for output by a receiver speaker. The sound leakage detector may provide a sound leakage indication if the sound leakage detector receives an input indicating a leakage of the receiver sound being output by the receiver speaker. Further, the audio processor may modify the receiver sound based on the sound leakage indication.

20 Claims, 8 Drawing Sheets

(51) Int. Cl.
*H03G 3/32* (2006.01)
*H03G 7/00* (2006.01)
*H04R 29/00* (2006.01)
*H04R 3/00* (2006.01)

(52) U.S. Cl.
CPC .......... *H04R 29/001* (2013.01); *H04W 88/02* (2013.01); *H04R 2430/01* (2013.01); *H04R 2499/11* (2013.01)

(56) References Cited

U.S. PATENT DOCUMENTS

| | | |
|---|---|---|
| 6,744,882 B1 | 6/2004 | Gupta et al. |
| 7,089,181 B2 | 8/2006 | Erell |
| 7,181,297 B1 | 2/2007 | Pluvinage et al. |
| 7,529,545 B2 | 5/2009 | Rader et al. |
| 7,630,887 B2 | 12/2009 | Erell |
| 8,229,130 B2 | 7/2012 | Paradiso et al. |
| 2001/0014161 A1 | 8/2001 | Baiker et al. |
| 2004/0125922 A1 | 7/2004 | Specht |
| 2006/0093161 A1 | 5/2006 | Falcon |
| 2007/0177753 A1 | 8/2007 | Weinans et al. |
| 2008/0152169 A1* | 6/2008 | Asada ................. H04R 5/04 381/107 |
| 2010/0322430 A1 | 12/2010 | Isberg |
| 2013/0185061 A1 | 7/2013 | Arvanaghi et al. |
| 2013/0243227 A1 | 9/2013 | Kinsbergen et al. |
| 2013/0279706 A1* | 10/2013 | Marti ................. G06F 3/165 381/57 |

OTHER PUBLICATIONS

International Search Report and Written Opinion for International Patent Application No. PCT/US2014/032922 mailed Aug. 19, 2014.

* cited by examiner

MODIFYING SOUND OUTPUT IN PERSONAL COMMUNICATION DEVICE

CROSS-REFERENCE TO RELATED APPLICATION

This Application is the U.S. National Stage filing under 35 U.S.C. §371 of PCT Application Ser. No. PCT/US14/32922 filed on Apr. 4, 2014. The disclosure of the PCT Application is hereby incorporated herein by reference in its entirety.

BACKGROUND

With the ubiquitous use of mobile communication devices such as smartphones and a rapid growth in mobile online communication applications, the leakage of privacy information has become one of the main issues to resolve in mobile communications. For example, when voice of the other party leaks out of a receiver speaker of a mobile phone during phone conversion, another person standing around or walking by the phone may hear or listen to the leaked voice, which may cause a privacy leakage issue. Also, the voice or sound leaking out of a receiver speaker of a mobile phone can sound as annoying noise to the other people who happen to be near the phone. For the purpose of avoiding the above issues, a user often manually tries to prevent the leakage of voice or privacy information, for example, by putting his/her hand over the phone or speaking in a lower tone. However, the other party's voice leaking out of the receiver speaker may not be properly controlled.

SUMMARY

Technologies generally described herein relate to modifying sound output in a personal communication device such as a mobile phone.

Various example personal communication device described herein may include one or more of a communication unit, an audio processor, and/or a sound leakage detector. The communication unit may be configured to receive a communication signal. The audio processor may be configured to convert the communication signal into receiver sound for output by a receiver speaker. The sound leakage detector may be configured to provide a sound leakage indication if the sound leakage detector receives an input indicating a leakage of the receiver sound being output by the receiver speaker. The audio processor may be further configured to modify the receiver sound based, at least in part, on the sound leakage indication.

In some examples, methods for modifying a sound output from a receiver speaker of a personal communication device are described. Example methods may include receiving a communication signal and converting the communication signal into receiver sound for output by the receiver speaker. An input indicating a leakage of the receiver sound being output by the receiver speaker may be detected. Further, the receiver sound may be modified based, at least in part, on the input.

In some examples, a computer-readable storage medium is described that may be adapted to store a program operable by the personal communication device. The personal communication device may include various features as further described herein. The program may include one or more instructions for receiving a communication signal, and converting the communication signal into receiver sound for output by the receiver speaker. The program may further include one or more instructions for detecting an input indicating a leakage of the receiver sound being output by the receiver speaker, and modifying the receiver sound based, at least in part, on the input.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
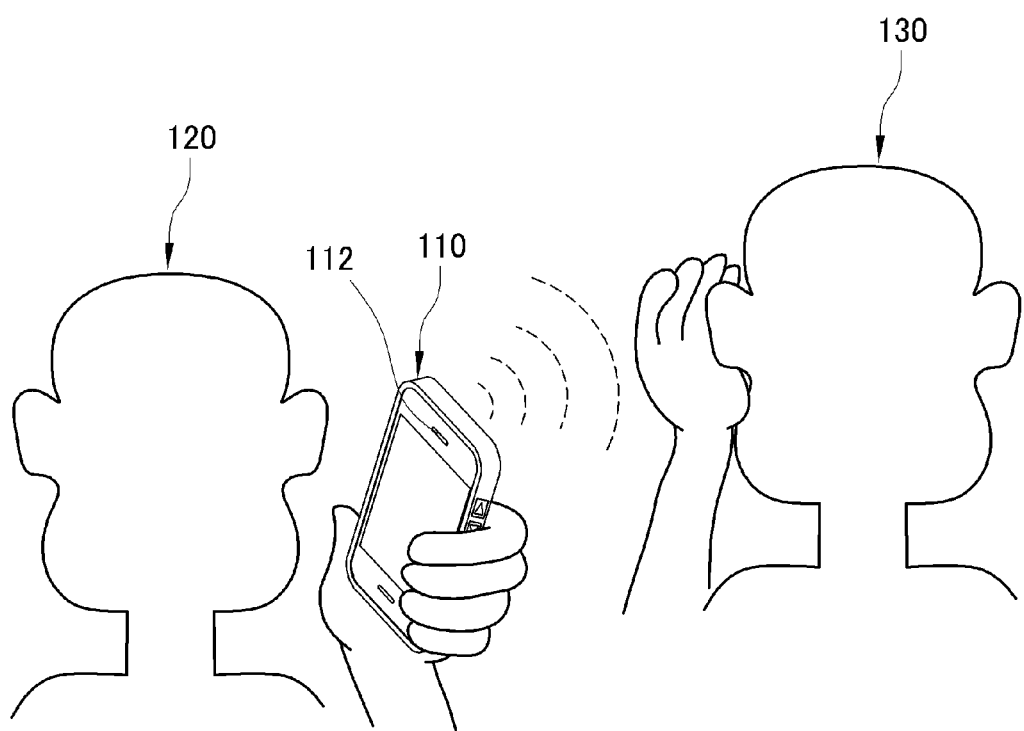
FIG. 1 illustrates an example scenario where a sound leaks out of a receiver speaker of a personal communication device and another person around the personal communication device listens to the leaked sound, arranged in accordance with at least some embodiments described herein.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices and computer program products related to modifying sound output in a personal communication device such as a mobile phone.

Briefly stated, technologies are generally described for modifying sound output in a personal communication device. Example devices described herein may include one or more of a communication unit, an audio processor, and/or a sound leakage detector. A communication signal may be received from the other party during personal communication by the communication unit. The communication signal may be converted by the audio processor into receiver sound for output by a receiver speaker. The sound leakage detector may provide a sound leakage indication if the sound leakage detector receives an input indicating a leakage of the receiver sound being output by the receiver speaker. Further, the audio processor may modify the receiver sound based on the sound leakage indication.

In some embodiments, the sound leakage indication may be provided if a user quickly turns down a volume level of the receiver speaker. Such sound leakage indication may be detected if a volume level of the receiver speaker is reduced twice or more times or reduced after the volume level is set to be a minimum volume level. In some other embodiments, the sound leakage indication may be provided if a user adjusts the volume level of the receiver speaker to be lower than a normal volume level, if a user puts the receiver speaker closer to the ear, or if a user tries to speak quietly by putting a hand around the device. Such sound leakage indication may be detected if an ambient sound (e.g., background noise, echo sound, etc.) detected by a sound sensor indicates that a power ratio of the receiver sound to the ambient sound is changed by more than a predetermined value. In some other embodiments, the sound leakage indication may be provided if a user quickly moves to another location. Such sound leakage indication may be detected if a position of the device detected by a positioning sensor is changed within a predetermined period of time.

In some embodiments, upon receiving the sound leakage indication, the audio processor may modify the receiver sound by reducing a volume level of the receiver speaker, for example, to be lower than a minimum volume level. In some other embodiments, upon receiving the sound leakage indication, the audio processor may modify the receiver sound by adding a masking noise, such as white noise or background music, to the receiver sound or outputting sound including the masking noise via an ambient speaker.

FIG. 1 schematically illustrates an example scenario where a sound leaks out of a receiver speaker of a personal communication device and another person around the personal communication device listens to the leaked sound, arranged in accordance with at least some embodiments described herein.

As depicted, while a user 120 is speaking on a mobile phone 110 such as a cellular phone or a smart phone, sound or voice transmitted from the other party's mobile phone may be reproduced and leak out of a receiver speaker 112 of mobile phone 110. In such case, another person 130 standing or walking by user 120 may intentionally or unintentionally hear the leaked sound which may include private information. Also, person 130 may feel annoyed by the sound leaking out of receiver speaker 112 because it may be considered as a noise.

When the sound leaks out of receiver speaker 112 of mobile phone 110 and is considered to be so loud that other persons including person 130 may hear the sound, user 120 may take various actions to prevent such leakage of the sound. For example, user 120 may push a key or button on mobile phone 110 to reduce a volume level one or more times. In another example, user 120 may try not to let the sound leak out of receiver speaker 112 as much as possible by putting receiver speaker 112 closer to the ear, by putting a hand around mobile phone 110, and/or by adjusting his/her voice tone to be lower. In still another example, user 120 may suddenly move his location to another location where person 130 may not be able to hear the sound output from receiver speaker 112.

In some embodiments, if it is detected that user 120 is taking at least one of the above actions to prevent the leakage of the sound out of receiver speaker 112, mobile phone 110 may perform one or more operations to modify the sound being output from receiver speaker 112 by using various methods as will be described in detail later.

Figure 2A:
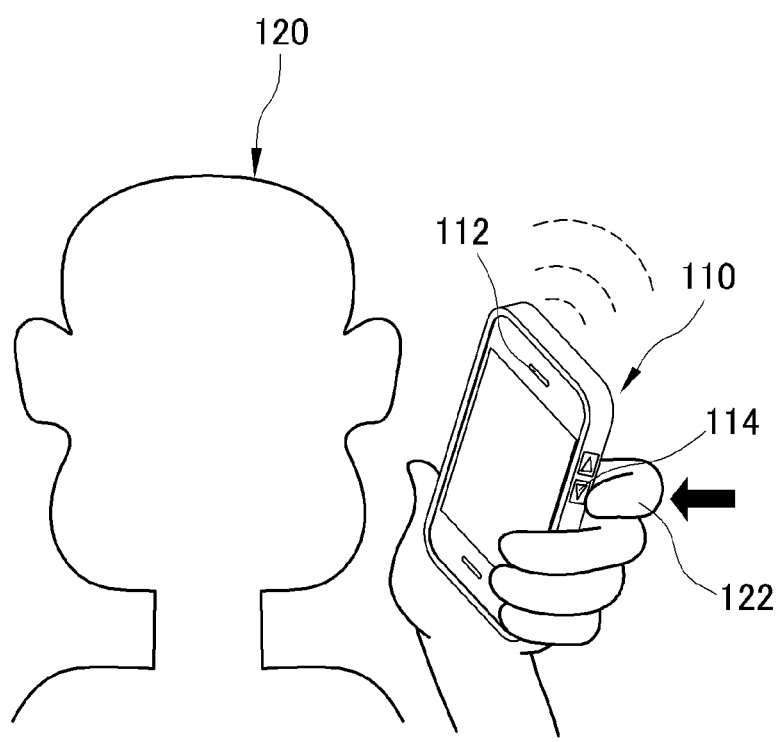
FIG. 2A shows an example scenario where a user adjusts a volume level of a personal communication device one or more times, which may indicate a sound leakage out of the personal communication device, arranged in accordance with at least some embodiments described herein.

FIG. 2A schematically shows an example scenario where a user adjusts a volume level of a personal communication device one or more times, which may indicate a sound leakage out of the personal communication device, arranged in accordance with at least some embodiments described herein. As illustrated, when sound leaks out of receiver speaker 112 of mobile phone 110 and is considered to be so loud that another person near mobile phone 110 may hear the sound, user 120 may try to prevent the leakage of the sound by pushing a volume control key 114 on mobile phone 110 by his/her finger 122 to reduce the volume level of receiver speaker 112.

In one example, user 120 may try to prevent the leakage of the sound by quickly or suddenly turning down the volume level of receiver speaker 112. Such sudden turning down the volume level of receiver speaker 112 may be determined if user 120 pushes volume control key 114 more than one times, for example, 3 times or more. Additionally or alternatively, user 120's sudden turning down the volume level of receiver speaker 112 may be determined if user 120 continue to push volume control key 114 even after the volume level has already been set to be a minimum level.

In another example, user 120 may try to prevent the leakage of the sound by adjusting the volume level of receiver speaker 112 to be lower than a normal volume level. Such adjustment of the volume level of receiver speaker 112 may be determined by comparing the intensity or power of the sound output from receiver speaker 112 with that of an ambient sound (e.g., background noise) detected around mobile phone 110. For example, the adjustment of the volume level of receiver speaker 112 to be lower than a normal volume level may be determined if a power ratio of the sound output from receiver speaker 112 to the background noise is reduced or changed by more than a predetermined value.

Figure 2B:
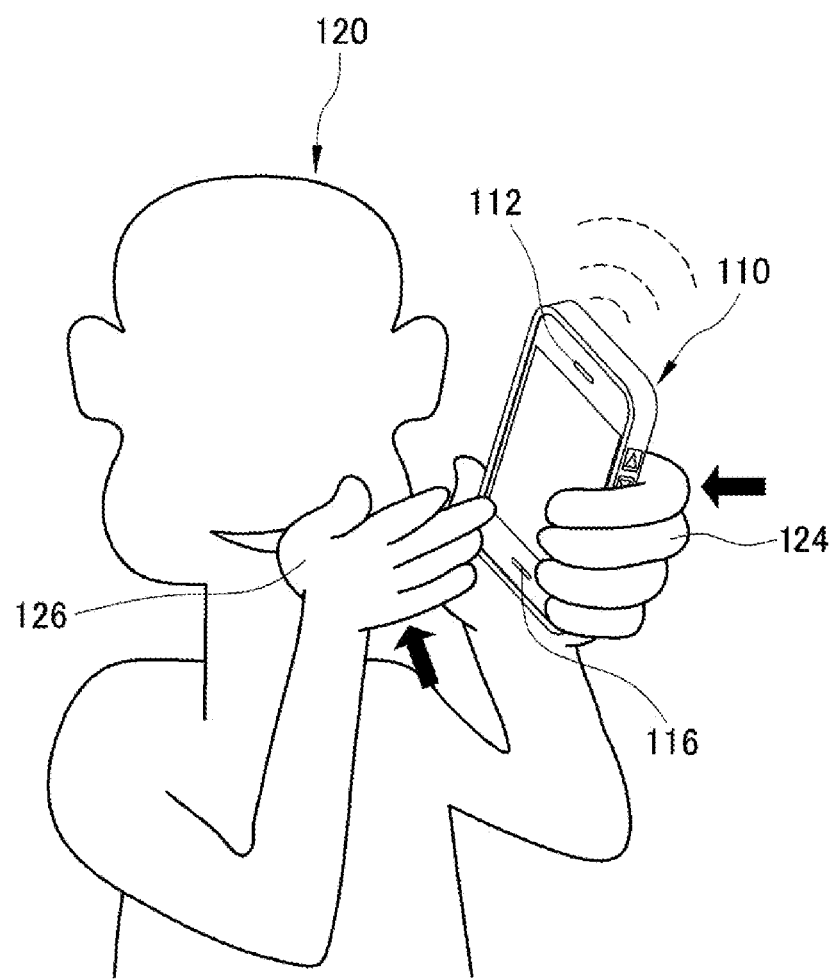
FIG. 2B shows an example scenario where a user puts his/her hand around a personal communication device, which may indicate a sound leakage out of the personal communication device, arranged in accordance with at least some embodiments described herein.

FIG. 2B schematically shows an example scenario where a user puts his/her hand around a personal communication device, which may indicate a sound leakage out of the personal communication device, arranged in accordance with at least some embodiments described herein. As illustrated, when sound leaks out of receiver speaker 112 of mobile phone 110 and is considered to be so loud that another person near mobile phone 110 may hear the sound, user 120 may try to prevent the leakage of the sound by moving receiver speaker 112 closer to the ear by one hand 124 and/or putting another hand 126 around a microphone 116 of mobile phone 110.

In one example, user 120 may try to prevent the leakage of the sound by moving receiver speaker 112 closer to the ear so that the sound being output from receiver speaker 112 can be substantially confined by the ear of user 120. Such action by user 120 may be determined by comparing the intensity or power of the sound output from receiver speaker 112 with that of an echo sound detected around mobile phone 110. As used herein, the term "echo sound" refers to sound that has been output via receiver speaker 112 and is input back to microphone 116. If user 120 moves receiver speaker 112 closer to the ear, the intensity of sound that leaks out of receiver speaker 112 becomes smaller and thus the echo sound also becomes smaller accordingly. For example, the movement of receiver speaker 112 closer to the ear may be determined if a power ratio of the receiver sound to the echo sound is increased by more than a predetermined value.

In some embodiments, the movement of receiver speaker 112 closer to the ear may be determined if the power ratio of the receiver sound to the echo sound is increased by more than a predetermined value and if a background noise level is lower than a predetermined value. In such cases, the background noise level may be detected by microphone 116 while user 120 is not speaking to microphone 116 or detected by another microphone that is located separately from microphone 116. In some other embodiments, the movement of receiver speaker 112 closer to the ear may be determined if the power ratio of the receiver sound to the echo sound is increased by more than a predetermined value and if the power or intensity of user 120's voice detected by microphone 116 is lower than a predetermined value, which may mean that user 120 intentionally speaks quietly. In some other embodiments, the movement of receiver speaker 112 closer to the ear may be detected by using a pressure sensor that may be installed near receiver speaker 112 which user 120's ear is pressed against.

In another example, user 120 may try to prevent the leakage of the sound by putting hand 126 around mobile phone 110 (or around his/her mouth) so that user 120's spoken voice can be substantially confined by hand 126. Such action by user 120 may be determined by comparing an echo path from receiver speaker 112 to microphone 116, which may refer to the intensity or power of the sound output from receiver speaker 112 with that of an echo sound detected around mobile phone 110, with a predetermined value. If user 120 puts hand 126 closer to microphone 116, the echo path from receiver speaker 112 to microphone 116 may also change abruptly. For example, putting hand 126 closer to microphone 116 may be determined if the echo path is changed by more than a predetermined value.

In still another example, user 120 may try to prevent the leakage of the sound by adjusting his/her voice tone to be lower so that user 120's spoken voice is not substantially heard by other persons. Such action by user 120 may be determined by comparing the intensity or power of ambient sound (e.g., background noise) with that of user 120's voice detected by mobile phone 110. The background noise may be detected by microphone 116 and stored while user 120 is not speaking to microphone 116. As such, adjusting the voice tone to be lower may be determined if an intensity ratio of the background noise to user 120's voice is greater than a predetermined value (or threshold). In some embodiments, multiple values of the intensity ratio of the background noise to user 120's voice may be periodically or aperiodically determined and stored in mobile phone 110. In this case, the threshold may be determined or adjusted based on the history data of the multiple intensity ratio values. In some other embodiments, the threshold may be determined or adjusted differently depending on the other party in communication with user 120. For example, while the threshold may be set to be greater in case of speaking to a person who is partly hearing-impaired, the threshold may be set to be lower otherwise. In some embodiments, user 120's action for adjusting the voice tone to be lower may be determined if user 120 puts microphone 116 closer to his/her mouth while speaking quietly, and then user 120 puts receiver speaker 112 closer to his/her ear while listening to the other party. For example, such action may be detected by using a motion sensor.

Figure 3:
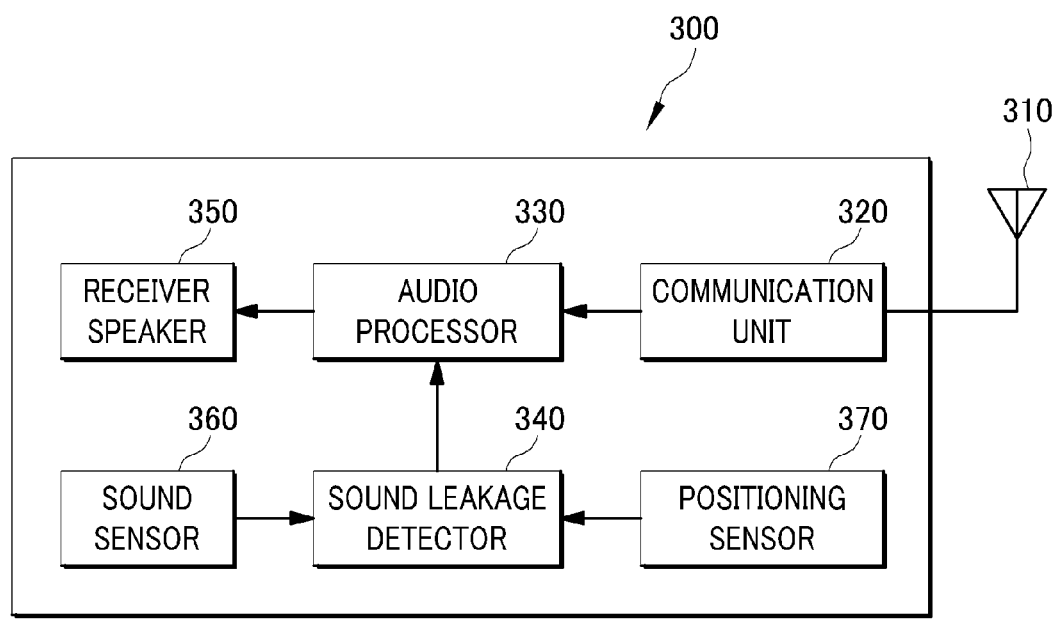
FIG. 3 shows a block diagram of an example personal communication device configured to modify a sound output from a receiver speaker, arranged in accordance with at least some embodiments described herein.

FIG. 3 schematically shows a block diagram of an example personal communication device configured to modify a sound output from a receiver speaker, arranged in accordance with at least some embodiments described herein. As illustrated, a personal communication device 300 may include one or more of a wireless antenna 310, a communication unit 320, an audio processor 330, a sound leakage detector 340, a receiver speaker 350, a sound sensor 360, and/or a positioning sensor 370. In some embodiments, personal communication device 300 may be any suitable type of personal communication device having audio processing and wired/wireless communication capabilities, including, but not limited to, a cellular phone, a cordless telephone, a smartphone, etc. The configuration of personal communication device 300 as shown in FIG. 3 and described in detail below may be implemented in mobile phone 110 used in the scenarios of FIGS. 1 to 2B.

In operation, communication unit 320 may be configured to receive a communication signal, for example, including voice or sound data, through wireless antenna 310. Audio processor 330 may be configured to convert the communication signal into receiver sound for output by receiver speaker 350. Further, sound leakage detector 340 may be configured to provide a sound leakage indication if sound leakage detector 340 receives an input indicating a leakage of the receiver sound being output by receiver speaker 350.

In some embodiments, personal communication device 300 may further include a volume controller (not shown) configured to adjust a volume level of receiver speaker 350. Further, personal communication device 300 may include sound sensor 360 configured to detect an ambient sound (e.g., background noise or echo sound) around personal communication device 300. For example, sound sensor 360 may include one or more microphones. Additionally, personal communication device 300 may include positioning sensor 370 configured to detect one or more positions of the device. For example, positioning sensor 370 may include at least one of a GPS (global positioning system) sensor and an accelerator sensor.

In some embodiments, sound leakage detector 340 may be further configured to receive one or more adjusted volume levels from the volume controller and provide the sound leakage indication if the adjusted volume levels indicate that a volume level of receiver speaker 350 is reduced at least twice or more times. Additionally or alternatively, sound leakage detector 340 may be configured to provide the sound leakage indication if the adjusted volume levels indicate that a volume level of receiver speaker 350 is reduced after the volume level is set to be a minimum volume level. The reduction of the volume levels twice or more times or the reduction of the volume levels after the volume level is set to be a minimum volume level may mean that a user wants to quickly or suddenly turn down the volume level of receiver speaker 350.

In some embodiments, sound leakage detector 340 may be further configured to receive the background noise detected by sound sensor 360 and provide the sound leakage indication if the background noise indicates that a power ratio of the receiver sound to the background noise is reduced. The reduction of the power ratio of the receiver sound to the background noise may mean that a user wants to adjust the volume level of receiver speaker 350 to be lower than a normal volume level.

In some embodiments, the power ratio of the receiver sound to the background noise may be determined as follows. The receiver sound S' may be determined by multiplying a sound signal S, which may be included in the received communication signal, with a gain G that is determined by the volume controller, as defined in Equation (1):

$$S' = G * S \quad \text{Equation (1)}$$

Further, the power ratio V of the receiver sound S' to the background noise X (which may be referred to as a "receiver-to-background ratio") may be defined using Equation (2):

$$V = \frac{S'^2}{X^2} \quad \text{Equation (2)}$$

The power ratio V may be smoothed using Equation (3):

$$V[n] = \alpha * V[n-1] + (1-\alpha) * \frac{S'^2[n]}{X^2[n]} \quad \text{Equation (3)}$$

where V[n] is an averaged receiver-to-background ratio that may mean that a user's average volume level has been adjusted according to the background noise at a time n.

$$\frac{S'^2[n]}{X^2[n]} < V[n-1] \quad \text{Equation (4)}$$

As expressed above in Equation (4), if a receiver-to-background ratio $S'^2[n]/X^2[n]$ at a time n is adjusted to be lower than an averaged receiver-to-background ratio V[n−1] at a previous time n−1, it may be determined that a user adjusts the volume level of receiver speaker 350 to be lower than a normal volume level. In some embodiments, Equation (4) may be converted to Equation (5):

$$G < \sqrt{V[n-1] * \frac{X^2[n]}{S^2[n]}} - g \quad \text{Equation (5)}$$

where a constant g indicates a margin that can be adjusted to minimize a false alarm. That is, if the gain G set by the volume controller is adjusted to be lower than a value calculated in the right side of Equation (5), it may be determined that a user adjusts the volume level of receiver speaker 350 to be lower than a normal volume level. V[n] can be measured and updated for each operation of adjusting the volume level of receiver speaker 350 according to Equation (6) below, and by using the updated V[n], the user's behavior may be detected more accurately.

$$G < \sqrt{V[n-1]_{atgivengain} * \frac{X^2[n]}{S^2[n]}} - g \quad \text{Equation (6)}$$

In some embodiments, sound leakage detector 340 may be further configured to receive an echo sound detected by sound sensor 360 and provide the sound leakage indication if the echo sound indicates that a power ratio of the receiver sound to the echo sound is increased by more than a predetermined value. The increase of the power ratio of the receiver sound to the echo sound may mean that a user puts receiver speaker 350 closer to the ear so that the receiver sound can be substantially confined by the ear of user 120.

In some embodiments, a user's action of putting receiver speaker 350 closer to the ear may be determined based on a power ratio V_echo of the receiver sound S' to an echo sound X_echo, which may be referred to as a "receiver-to-echo ratio" and may be defined using Equation (7):

$$V\_echo = \frac{S'^2}{X\_echo^2} \quad \text{Equation (7)}$$

where the echo sound X_echo indicates a sound that has been output via receiver speaker 350 and is input back to sound sensor 360. If the user moves receiver speaker 350 closer to the ear, the intensity of the sound output via receiver speaker 350 becomes smaller and thus the intensity of the echo sound X_echo also becomes smaller accordingly. As a result, the receiver-to-echo ratio V_echo becomes significantly greater. Thus, as expressed below in Equations (8) and (9), if a receiver-to-echo ratio $S'^2[n]/X\_echo^2[n]$ at a time n is adjusted to be greater than an averaged receiver-to-echo ratio V_echo[n−1] at a previous time n−1, it may be determined that a user puts receiver speaker 350 closer to the ear.

$$V\_echo[n] = \alpha * V\_echo[n-1] + (1-\alpha) * \frac{S'^2[n]}{X\_echo^2[n]} \quad \text{Equation (8)}$$

$$\frac{S'^2[n]}{X\_echo^2[n]} > V\_echo[n-1] + e \quad \text{Equation (9)}$$

where a constant e indicates a margin that can be adjusted to minimize a false alarm.

In some embodiments, sound leakage detector 340 may be further configured to receive the echo sound detected by sound sensor 360 and provide the sound leakage indication if the echo sound indicates that an echo path (which may refer to an intensity ratio of the echo sound to the receiver sound) is changed by more than a predetermined value. The change of the echo path may mean that a user wants to speak quietly by putting a hand around sound sensor 360.

In some embodiments, the echo path E may be defined using Equation (10):

$$E = \frac{X\_echo}{S'} \quad \text{Equation (10)}$$

If a user puts a hand around sound sensor 360, the echo path E can be significantly increased because the intensity of the echo sound X_echo is increased. Thus, if the echo path is changed by more than a predetermined value, it may be determined that a user wants to speak quietly by putting a hand around sound sensor 360.

In some embodiments, sound leakage detector 340 may be further configured to receive the positions of device 300 from positioning sensor 370 and provide the sound leakage indication if the positions indicate that a position of device 300 is changed within a predetermined period of time. For example, if a position of device 300 is changed within a certain period of time after beginning a phone conversation on device 300, it may be determined that a user does not want the receiver sound to leak out of receiver speaker 350 to the surroundings of device 300.

Figure 4:
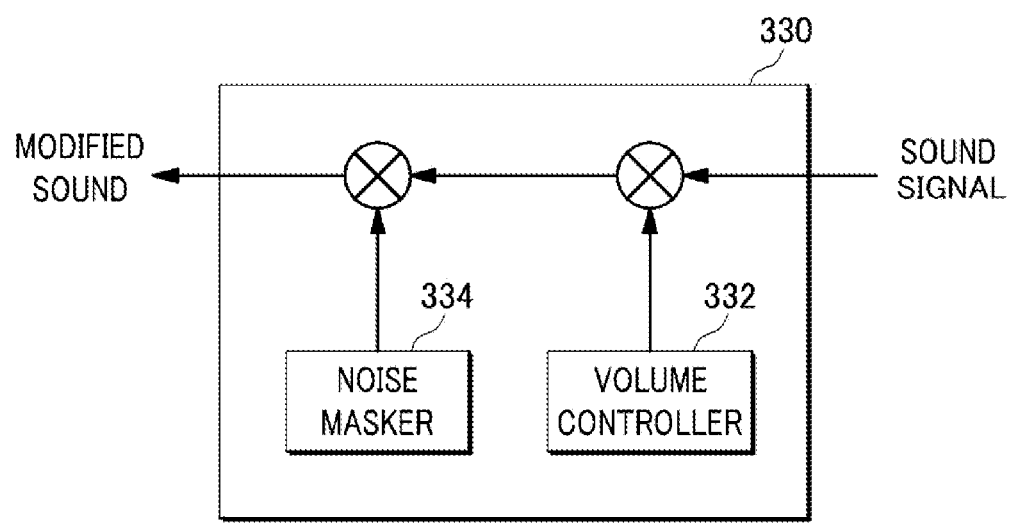
FIG. 4 shows a block diagram of an example audio processor configured to modify a sound signal based on a sound leakage indication, arranged in accordance with at least some embodiments described herein.

In some embodiments, audio processor 330 may be further configured to modify the receiver sound based on the sound leakage indication. FIG. 4 schematically shows a block diagram of an example audio processor configured to modify a sound signal based on a sound leakage indication, arranged in accordance with at least some embodiments described herein. As depicted, audio processor 330 may include one or more of a volume controller 332 and/or a noise masker 334. In some embodiments, volume controller 332 may be configured to adjust a volume level of receiver speaker 350. Further, noise masker 334 may be configured to generate masking noise.

In operation, audio processor 330 may be further configured to, upon receiving the sound leakage indication, control volume controller 332 to reduce a volume level of receiver speaker 350. Alternatively, audio processor 330 may be further configured to, upon receiving the sound leakage indication, control volume controller 332 to reduce a volume level of receiver speaker 350 to be lower than a minimum volume level. In some embodiments, the reduction of the volume level of receiver speaker 350 may be performed differently for different frequency bandwidths of the sound output from receiver speaker 350. For example, because the high frequency components of the sound output have greater directivity than the low frequency components of the sound output, the volume level of the high frequency components may be selectively adjusted to be lower than the normal volume level.

For example, it may be assumed that personal communication device 300 has 5 levels (that is, level 1 to level 5) of volume corresponding to gain values of 0.6, 0.7, 0.8, 0.9 and 1.0, respectively. In this case, if the volume level is adjusted to be a minimum volume level (that is, level 1), the receiver sound having an intensity of 0.6*S may be output via receiver speaker 350. In some embodiments, upon receiving the sound leakage indication, audio processor 330 may control volume controller 332 to reduce the volume level of receiver speaker 350 to be lower than level 1. For example, audio processor 330 may control volume controller 332 to reduce the volume level of receiver speaker 350 to be a new minimum volume level 0 corresponding to a gain value of 0.2.

In some embodiments, audio processor 330 may be further configured to, upon receiving the sound leakage indication, receive the masking noise from noise masker 334 and add the masking noise to the receiver sound. The masking noise may include at least one of white noise or background music. In some embodiments, personal communication device 300 may further include an ambient speaker (not shown) configured to output sound based on the masking noise. For example, personal communication device 300 may further include two or more ambient speakers or receiver speakers 350. In this case, the locations/directions/phases of the speakers in device 300 may be adjusted such that the masking noise is nullified at or around the ear of the user while the masking noise sounds with a greater volume in the surroundings of the ear.

Figure 5:
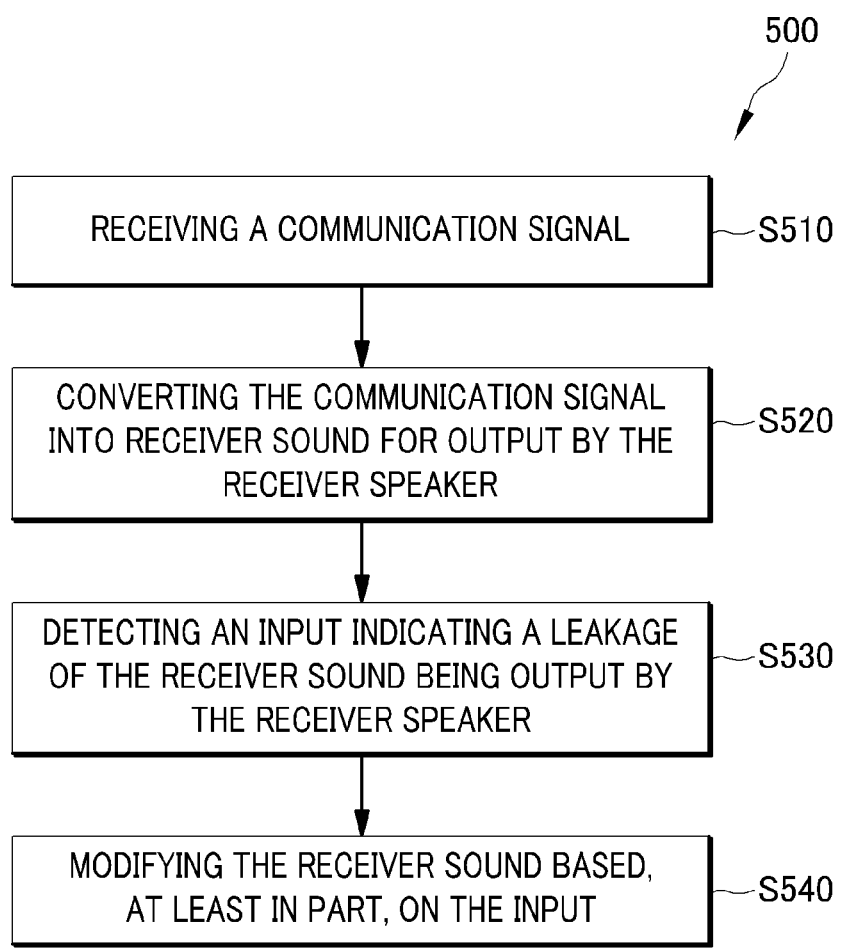
FIG. 5 illustrates an example flow diagram of a method adapted to modify a sound output from a receiver speaker of a personal communication device.

FIG. 5 illustrates an example flow diagram of a method adapted to modify a sound output from a receiver speaker of a personal communication device, arranged in accordance with at least some embodiments described herein. An example method 500 in FIG. 5 may be implemented using, for example, a computing device including a processor adapted to modify a sound output from a receiver speaker of a personal communication device.

Method 500 may include one or more operations, actions, or functions as illustrated by one or more of blocks S510, S520, S530 and/or S540. Although illustrated as discrete blocks, various blocks may be divided into additional blocks, combined into fewer blocks, or eliminated, depending on the desired implementation. In some further examples, the various described blocks may be implemented as a parallel process instead of a sequential process, or as a combination thereof. Method 500 may begin at block S510, "RECEIVING A COMMUNICATION SIGNAL."

At block S510, a communication signal may be received. As depicted in FIG. 3, a communication signal may be received by communication unit 320 through a wireless antenna 310. For example, the communication signal may include voice or sound data. Block S510 may be followed by block S520, "CONVERTING THE COMMUNICATION SIGNAL INTO RECEIVER SOUND FOR OUTPUT BY THE RECEIVER SPEAKER."

At block S520, the communication signal may be converted into receiver sound for output by the receiver speaker. As illustrated in FIG. 3, the communication signal may be converted by audio processor 330 into receiver sound for output by receiver speaker 350. Block S520 may be followed by block S530, "DETECTING AN INPUT INDICATING A LEAKAGE OF THE RECEIVER SOUND BEING OUTPUT BY THE RECEIVER SPEAKER."

At block S530, an input indicating a leakage of the receiver sound being output by the receiver speaker may be detected. As illustrated in FIG. 3, sound leakage detector 340 may provide a sound leakage indication if sound leakage detector 340 receives an input indicating a leakage of the receiver sound being output by receiver speaker 350.

In some embodiments, sound leakage detector 340 may receive one or more adjusted volume levels from the volume controller and provide the sound leakage indication if the adjusted volume levels indicate that a volume level of receiver speaker 350 is reduced at least twice or more times. Additionally or alternatively, sound leakage detector 340 may provide the sound leakage indication if the adjusted volume levels indicate that a volume level of receiver speaker 350 is reduced after the volume level is set to be a minimum volume level.

In some embodiments, sound leakage detector 340 may receive the ambient sound (e.g., background noise) detected by sound sensor 360 and provide the sound leakage indication if the background noise indicates that a power ratio of the receiver sound to the background noise is reduced. In some other embodiments, sound leakage detector 340 may receive the ambient sound (e.g., echo sound) detected by sound sensor 360 and provide the sound leakage indication if the echo sound indicates that a power ratio of the receiver sound to the echo sound is increased by more than a predetermined value. Alternatively, sound leakage detector 340 may receive the ambient sound (e.g., echo sound) detected by sound sensor 360 and provide the sound leakage indication if the echo sound indicates that an echo path (which may refer to an intensity ratio of the echo sound to the receiver sound) is changed by more than a predetermined value.

In some embodiments, sound leakage detector 340 may receive the positions of device 300 from positioning sensor 370 and provide the sound leakage indication if the positions indicate that a position of device 300 is changed within a predetermined period of time. Block S530 may be followed by block S540, "MODIFYING THE RECEIVER SOUND BASED, AT LEAST IN PART, ON THE INPUT."

At block S540, the receiver sound may be modified based, at least in part, on the input. As depicted in FIG. 3, the receiver sound may be modified by audio processor 330 based on the sound leakage indication. In some embodiments, upon receiving the sound leakage indication, audio processor 330 may control volume controller 332 to reduce a volume level of receiver speaker 350. Alternatively, upon receiving the sound leakage indication, audio processor 330 may control volume controller 332 to reduce a volume level of receiver speaker 350 to be lower than a minimum volume level. In some embodiments, upon receiving the sound leakage indication, audio processor 330 may receive the masking noise from noise masker 334 and add the masking noise to the receiver sound. The masking noise may include at least one of white noise or background music.

Figure 6:
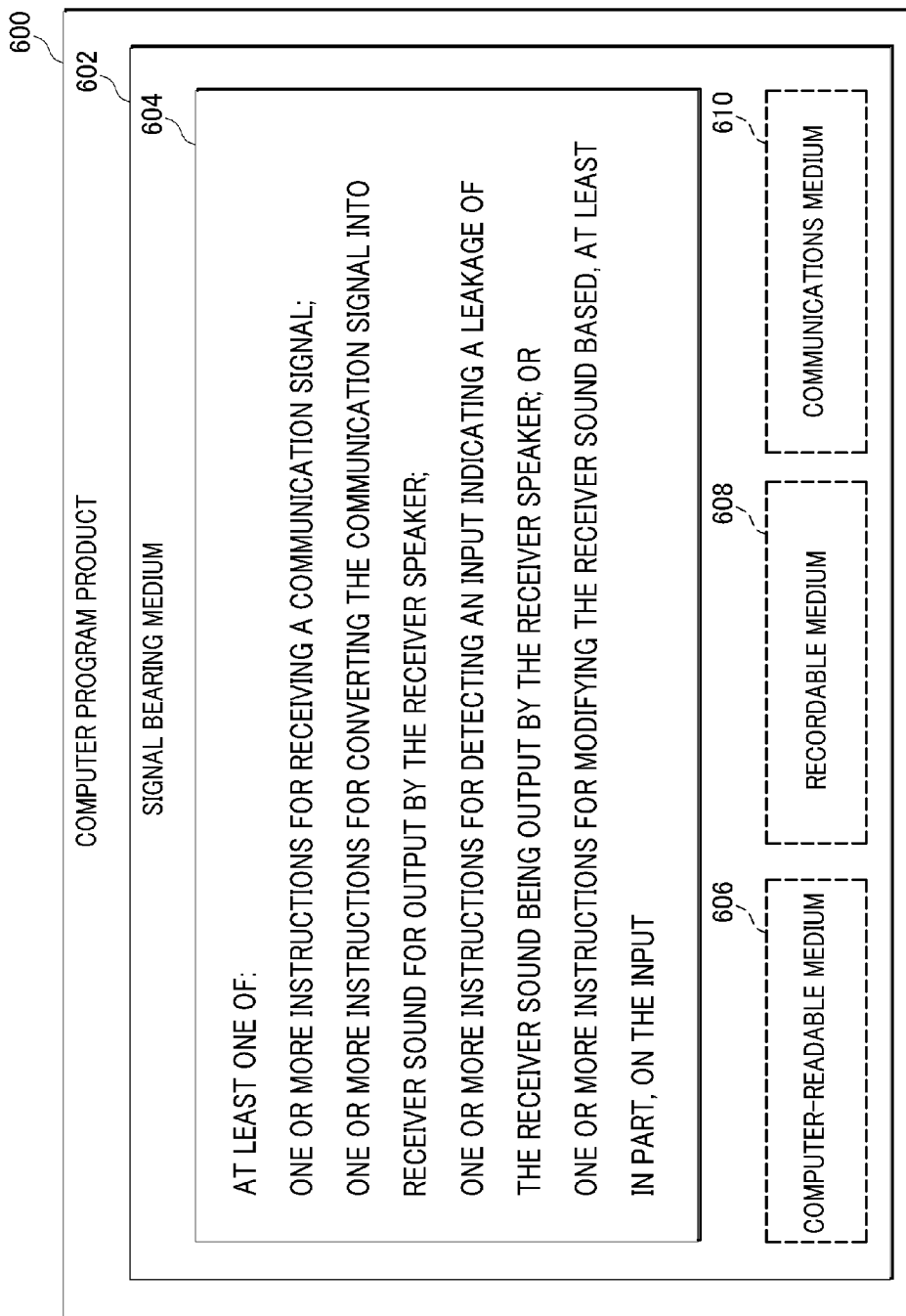
FIG. 6 illustrates an example computer program product that may be utilized to modify a sound output from a receiver speaker of a personal communication device, arranged in accordance with at least some embodiments described herein.

FIG. 6 illustrates an example computer program product that may be utilized to modify a sound output from a receiver speaker of a personal communication device, arranged in accordance with at least some embodiments described herein. Computer program product 600 may include a signal bearing medium 602. Signal bearing medium 602 may include one or more instructions 604 that, when executed by, for example, a processor, may provide the functionality described above with respect to FIGS. 1 to 5. By way of example, instructions 604 may include at least one of: one or more instructions for receiving a communication signal; one or more instructions for converting the communication signal into receiver sound for output by the receiver speaker; one or more instructions for detecting an input indicating a leakage of the receiver sound being output by the receiver speaker; or one or more instructions for modifying the receiver sound based, at least in part, on the input. Thus, for example, referring to FIGS. 1 to 4, mobile phone 110 or personal communication device 300 may undertake one or more of the blocks shown in FIG. 5 in response to instructions 604.

In some implementations, signal bearing medium 602 may encompass a computer-readable medium 606, such as, but not limited to, a hard disk drive (HDD), a Compact Disc (CD), a Digital Video Disk (DVD), a digital tape, memory, etc. In some implementations, signal bearing medium 602 may encompass a recordable medium 608, such as, but not limited to, memory, read/write (R/W) CDs, R/W DVDs, etc. In some implementations, signal bearing medium 602 may encompass a communications medium 610, such as, but not limited to, a digital and/or an analog communication medium (e.g., a fiber optic cable, a waveguide, a wired communications link, a wireless communication link, etc.). Thus, for example, computer program product 600 may be conveyed to one or more modules of mobile phone 110 or personal communication device 300 by signal bearing medium 602, where signal bearing medium 602 is conveyed by communications medium 610 (e.g., a wireless communications medium conforming with the IEEE 802.11 standard).

Figure 7:
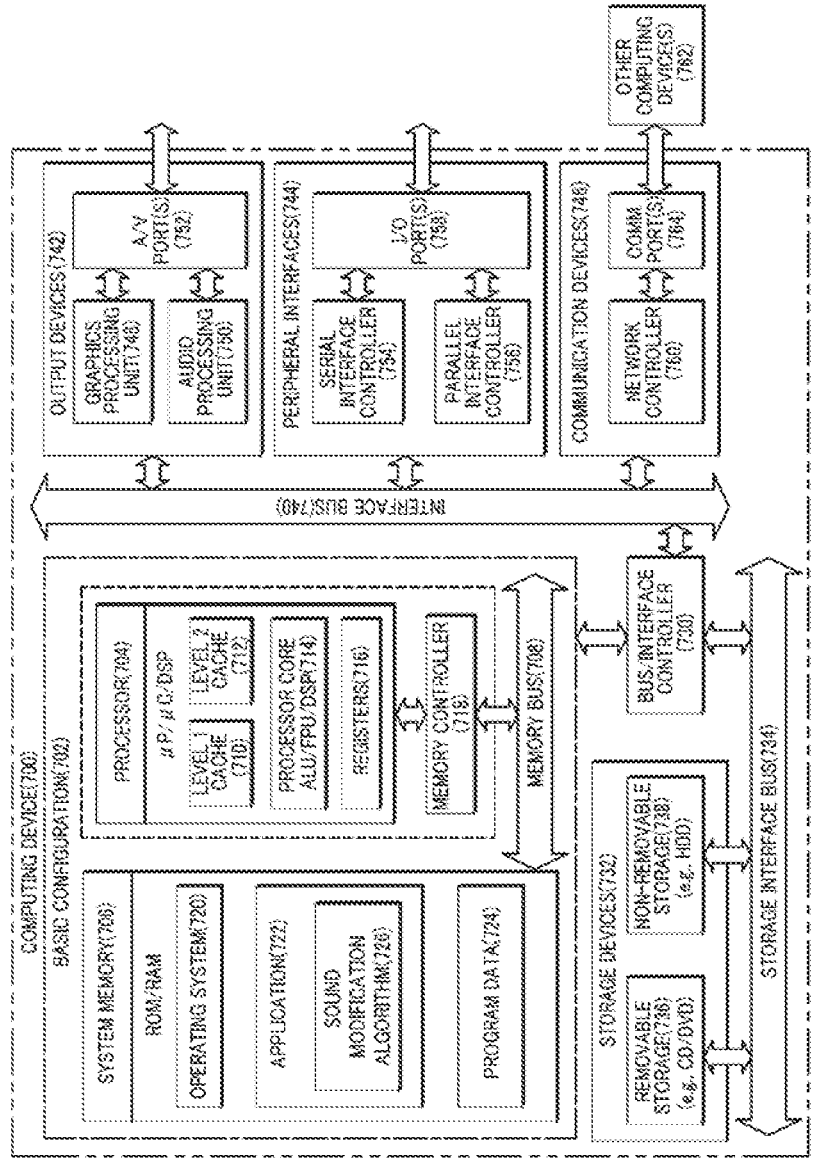
FIG. 7 is a block diagram illustrating an example computing device that may be utilized modify a sound output from a receiver speaker of a personal communication device, arranged in accordance with at least some embodiments described herein, all arranged in accordance with at least some embodiments described herein.

FIG. 7 is a block diagram illustrating an example computing device that may be utilized modify a sound output from a receiver speaker of a personal communication device, arranged in accordance with at least some embodiments described herein.

In a very basic configuration 702, computing device 700 typically includes one or more processors 704 and a system memory 706. A memory bus 708 may be used for communicating between processor 704 and system memory 706.

Depending on the desired configuration, processor 704 may be of any type including but not limited to a microprocessor ($\mu$P), a microcontroller ($\mu$C), a digital signal processor (DSP), or any combination thereof. Processor 704 may include one or more levels of caching, such as a level one cache 710 and a level two cache 712, a processor core 714, and registers 716. An example processor core 714 may include an arithmetic logic unit (ALU), a floating point unit (FPU), a digital signal processing core (DSP Core), or any combination thereof. An example memory controller 718 may also be used with processor 704, or in some implementations memory controller 718 may be an internal part of processor 704.

Depending on the desired configuration, system memory 706 may be of any type including but not limited to volatile memory (such as RAM), nonvolatile memory (such as ROM, flash memory, etc.) or any combination thereof. System memory 706 may include an operating system 720, one or more applications 722, and program data 724.

Application 722 may include a sound modification algorithm 726 that may be arranged to control a personal communication device in such a manner as described above with respect to FIGS. 1 to 5. Program data 724 may include any data that may be useful for providing the sound modification scheme as is described herein. In some examples, application 722 may be arranged to operate with program data 724 on an operating system 720 such that the sound modification scheme as described herein may be provided.

Computing device 700 may have additional features or functionality, and additional interfaces to facilitate communications between basic configuration 702 and any required devices and interfaces. For example, a bus/interface controller 730 may be used to facilitate communications between basic configuration 702 and one or more data storage devices 732 via a storage interface bus 734. Data storage devices 732 may be removable storage devices 736, non-removable storage devices 738, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 706, removable storage devices 736 and non-removable storage devices 738 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 700. Any such computer storage media may be part of computing device 700.

Computing device 700 may also include an interface bus 740 for facilitating communication from various interface devices (e.g., output devices 742, peripheral interfaces 744, and communication devices 746) to basic configuration 702 via bus/interface controller 730. Example output devices 742 include a graphics processing unit 748 and an audio processing unit 750, which may be configured to communicate to various external devices such as a display or speakers via one or more A/V ports 752. Example peripheral interfaces 744 include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. An example communication device 746 includes a network controller 760, which may be arranged to facilitate communications with one or more other computing devices 762 over a network communication link via one or more communication ports 764.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The present disclosure is not to be limited in terms of the particular embodiments described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A personal communication device comprising:
    a communication unit configured to receive a communication signal;
    an audio processor configured to convert the communication signal into receiver sound for output by a receiver speaker;
    a volume controller configured to dynamically adjust a volume level of the receiver speaker; and
    a sound leakage detector configured to:
        provide a sound leakage indication if the sound leakage detector receives an input indicating a leakage of the receiver sound being output by the receiver speaker, the input comprising an input received from the volume controller indicating the volume level of the receiver speaker being reduced by a user more than two times,
    wherein the audio processor is further configured to modify the receiver sound based, at least in part, on the sound leakage indication.

2. The device of claim 1, wherein the input further comprises an input received from the volume controller indicating that the volume level of the receiver speaker is reduced after the volume level of the receiver speaker is set to be a minimum volume level.

3. The device of claim 1, further comprising a sound sensor configured to detect an ambient sound.

4. The device of claim 3, wherein the sound leakage detector is further configured to receive the ambient sound detected by the sound sensor and provide the sound leakage indication if the ambient sound indicates that a power ratio of the receiver sound to the ambient sound is reduced.

5. The device of claim 3, wherein the sound leakage detector is further configured to receive the ambient sound detected by the sound sensor and provide the sound leakage indication if the ambient sound indicates that a power ratio of the receiver sound to the ambient sound is increased by more than a predetermined value.

6. The device of claim 3, wherein the sound leakage detector is further configured to receive the ambient sound detected by the sound sensor and provide the sound leakage indication if the ambient sound indicates that an intensity ratio of the ambient sound to the receiver sound is changed by more than a predetermined value.

7. The device of claim 1, further comprising a positioning sensor configured to detect one or more positions of the device.

8. The device of claim 7, wherein the sound leakage detector is further configured to receive the one or more positions of the device from the positioning sensor and provide the sound leakage indication if the one or more positions indicate that the device has changed positions within a predetermined period of time.

9. The device of claim 1, further comprising a noise masker configured to generate masking noise.

10. The device of claim 9, wherein the masking noise includes at least one of white noise or background music.

11. The device of claim 9, wherein the audio processor is further configured to receive the masking noise from the noise masker and add the masking noise to the receiver sound.

12. The device of claim 9, further comprising an ambient speaker configured to output sound based, at least in part, on the masking noise.

13. A method to modify a sound output from a receiver speaker of a personal communication device, the method comprising:
    receiving a communication signal;
    converting the communication signal into receiver sound for output by the receiver speaker;
    detecting an input indicating a leakage of the receiver sound being output by the receiver speaker by detecting an input indicating that a volume level of the receiver speaker is reduced by a user more than two times; and
    modifying the receiver sound based, at least in part, on the input.

14. The method of claim 13, wherein the detecting of the input comprises detecting an input indicating that the volume level of the receiver speaker is reduced after the volume level of the receiver speaker is set to be a minimum volume level.

15. The method of claim 13, further comprising detecting an ambient sound by a sound sensor,
    wherein the detecting of the input comprises detecting an input indicating that a power ratio of the receiver sound to the ambient sound is reduced.

16. The method of claim 13, further comprising detecting an ambient sound by a sound sensor,
    wherein the detecting of the input comprises detecting an input indicating that a power ratio of the receiver sound to the ambient sound is increased by more than a predetermined value.

17. The method of claim 13, further comprising detecting an ambient sound by a sound sensor,
    wherein the detecting of the input comprises detecting an input indicating that an intensity ratio of the ambient sound to the receiver sound is changed by more than a predetermined value.

18. The method of claim 13, wherein the detecting of the input comprises detecting an input indicating that a position of the device is changed within a predetermined period of time.

19. The method of claim 13, wherein the modifying of the receiver sound comprises adding masking noise to the receiver sound.

20. A non-transitory computer-readable storage medium having stored thereon, computer-executable instructions that, if executed by a personal communication device, cause the personal communication device to perform operations comprising:

receiving a communication signal;

converting the communication signal into receiver sound for output by a receiver speaker;

detecting an input indicating a leakage of the receiver sound being output by the receiver speaker, wherein the detecting comprises detecting an input indicating that a volume level of the receiver speaker is reduced by a user greater than two times; and modifying the receiver sound based, at least in part, on the input.

\* \* \* \* \*